United States Patent [19]

Ho et al.

[11] 4,305,043
[45] Dec. 8, 1981

[54] COUPLER HAVING ARBITRARY IMPEDANCE TRANSFORMATION RATIO AND ARBITRARY COUBLING RATIO

[75] Inventors: Pang T. Ho, Mountain View; Michael D. Rubin, Saratoga, both of Calif.

[73] Assignee: Ford Aerospace & Communications Corporation, Detroit, Mich.

[21] Appl. No.: 126,771

[22] Filed: Mar. 3, 1980

[51] Int. Cl.³ .......................... H03F 3/60; H01P 5/18
[52] U.S. Cl. ...................................... 330/53; 330/286; 333/116; 333/111
[58] Field of Search .................. 330/53, 286, 287; 333/109, 111, 112, 115, 116, 120, 125, 127, 128

[56] References Cited

U.S. PATENT DOCUMENTS

| | | |
|---|---|---|
| 3,423,688 | 1/1969 | Seidel . |
| 3,516,024 | 6/1970 | Lange . |
| 3,654,570 | 4/1972 | Thomas . |
| 3,772,616 | 11/1973 | Imoto .............................. 333/116 X |
| 3,911,372 | 10/1975 | Seidel .................. 330/286 |
| 4,027,254 | 5/1977 | Gunton et al. . |
| 4,127,831 | 11/1978 | Riblet . |
| 4,127,832 | 11/1978 | Riblet . |

FOREIGN PATENT DOCUMENTS 2837817  3/1979  Fed. Rep. of Germany ...... 330/286

Primary Examiner—Paul L. Gensler
Attorney, Agent, or Firm—Edward J. Radlo; Clifford L. Sadler

[57] ABSTRACT

An impedance transforming coupler is disclosed which may be used as a power divider or power combiner at microwave frequencies. The power division or power combination ratio is arbitrary, and the impedance transformation ratio is arbitrary. These couplers may be used in a circuit to power-combine amplifiers. The insertion loss of the circuit is low and the bandwidth is improved by an order of two to one over prior art systems which had separate circuits for matching the impedance and providing power combining. The coupler is optimally a branch line coupler having four curved branches a quarter wavelength long at the center frequency. The output ports are 90° out of phase. Simple formulas are given relating the desired admittances of each of the four branches to k, the desired power coupling ratio, and Y, the desired admittance transformation ratio.

7 Claims, 7 Drawing Figures

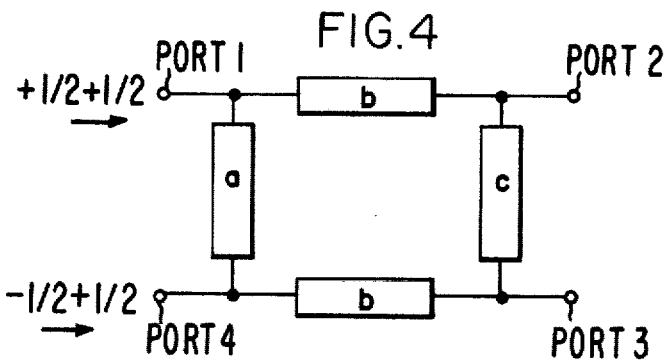
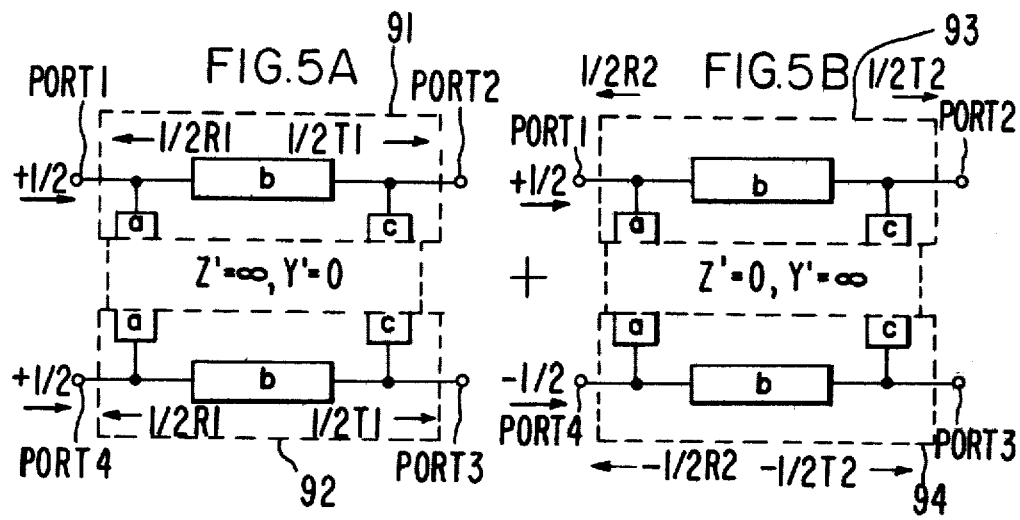
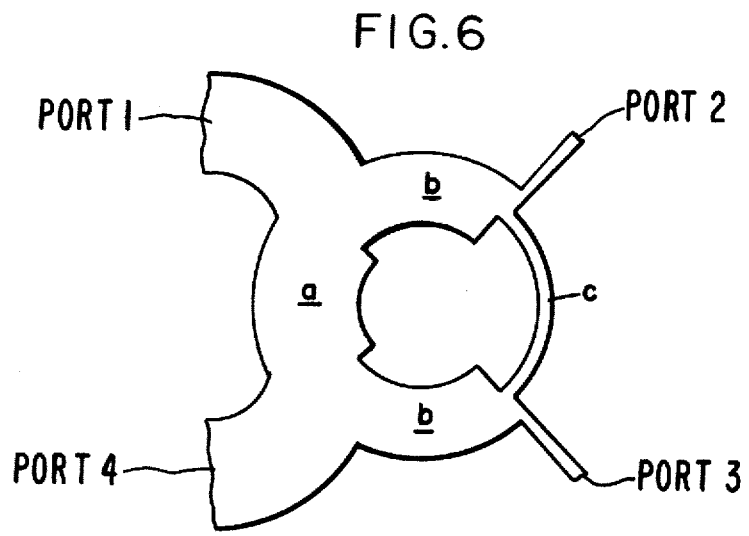

COUPLER HAVING ARBITRARY IMPEDANCE TRANSFORMATION RATIO AND ARBITRARY COUBLING RATIO

BACKGROUND OF THE INVENTION

1. Field of the Invention

This invention is a circuit for power combining two or more amplifier elements at microwave frequencies employing a novel coupler which simultaneously couples with an arbitrary power coupling (combining or dividing) ratio and matches to an arbitrary impedance.

2. Description of the Prior Art

A prior art search was performed and uncovered the following U.S. patent references:

U.S. Pat. No. 3,772,616 is an impedance matching power divider. The power division ratio is always unity, unlike in the present invention. The patent speaks just in terms of power division, not power combining as in the present invention. The branches of the circuit are rectangular, not curved as in the present invention.

U.S. Pat. No. 3,516,024 is a coupler with no impedance transformation capability, and without the capabilities for an arbitrary power division or combining ratio.

U.S. Pat. No. 3,423,688 shows various couplers but does not show impedance transformation.

U.S. Pat. No. 3,654,570 is a hybrid junction device without having an arbitrary power coupling ratio. In order to fulfill the prophecy of column 3 line 53 et seq. that other impedance values can be accommodated, the patentee would have to use additional components not shown in his patent.

U.S. Pat. No. 4,127,831 is a coupler which does not match impedances other than 50 ohms. The function of the stubs is to broaden the 50 ohm bandwidth.

U.S. Pat. Nos. 4,127,832 and 4,027,254 are couplers without an impedance transformation capability.

Secondary references are U.S. Pat. Nos. 3,237,130, 3,600,707, 4,016,503, and 3,063,026.

SUMMARY OF THE INVENTION

The present invention is a power coupler (divider or combiner) operable at microwave frequencies having both an arbitrary power coupling capability and an arbitrary impedance matching capability.

When used to power combine a pair of amplifier elements, the bandwidth of the resulting circuit is improved by an order of two to one over circuits of the prior art using separate devices for impedance transformation and power combining. The insertion loss is also significantly lower, and the size of the circuit is reduced.

The coupler is optimally a branch line coupler having four circularly curved arcuate branches, which provide a greater bandwidth than rectangular branches. The four branches are each an odd multiple of a quarter wavelength long at the center frequency. The output ports of the coupler are 90° out of phase.

Two of the branches of the coupler have normalized admittances equal to $\sqrt{(Y/k)+Y}$ where k is the desired power coupling ratio, and Y (the reciprocal of impedance ratio Z) is the desired ratio of load admittance to source admittance. The input branch has a normalized admittance equal to $1/\sqrt{k}$ and the output branch has a normalized admittance equal to $Y/\sqrt{k}$.

These normalized admittances are then converted into actual admittances and then into appropriate heights and widths of the selected conductor. The branches each have a length equal to a quarter electrical wavelength at the desired center operating frequency.

BRIEF DESCRIPTION OF THE DRAWINGS

These and other more detailed and specific objects and features of the present invention are more fully disclosed in the following specification, reference being had to the accompanying drawings, in which:

FIG. 4 is a circuit which is equivalent to that depicted in FIG. 3;

FIG. 5 comprises two drawings, FIGS. 5a and 5b, which together are equivalent to the circuit depicted in FIG. 4; and FIG. 6 is a shadow-graph of a branch line coupler constructed according to the teachings of the present invention.

DESCRIPTION OF THE PREFERRED EMBODIMENTS

Figure 1:
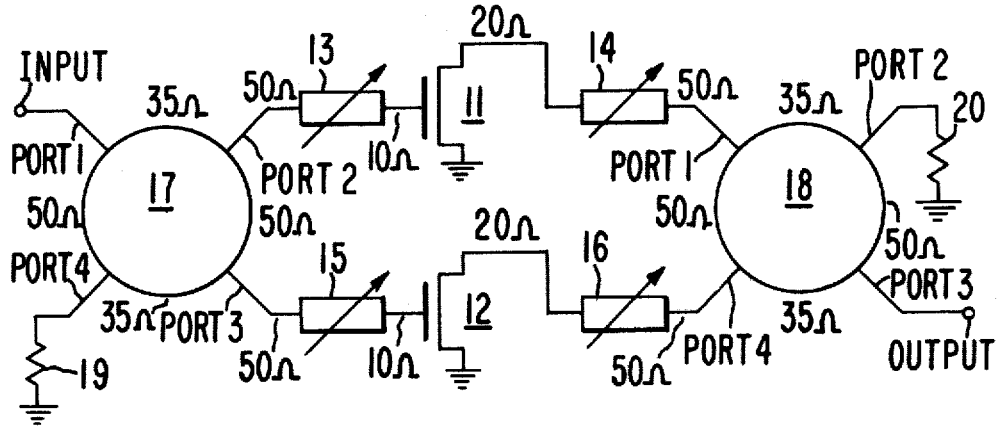
FIG. 1 is a circuit diagram representing the state of the prior art.

The design of power combined solid state amplifiers capable of operation at microwave frequencies normally entails each amplifier element being fitted with impedance matching circuits on each end, so as to match the amplifier to the conventional 50 ohm source and 50 ohm load impedances. Symmetrical 50 ohm to 50 ohm couplers are then used to combine two or more amplifier elements to create the power combined solid state amplifier circuit. The power combining efficiency of the combined amplifier is determined by the impedance transformation circuit loss and the coupler circuit loss. The impedance transformation circuit loss is normally a direct function of the impedance transformation ratio. The higher the impedance transformation ratio, the higher the transformation circuit loss. The impedance transformation circuit loss may vary from 0.1 dB to as much as 0.5 dB, depending upon the transformation circuit used.

The power combining bandwidth of the circuit is limited by the impedance transformation ratio, the bandwidth of the couplers, and the bandwidths of the solid state amplifier elements. The bandwidth of each amplifier element is a strong function of the impedance transformation ratio also (the lower the impedance transformation ratio the wider the bandwidth). Therefore, ideally, the circuit loading impedance should be close to the inherent impedance level of each amplifier element for best bandwidth and minimum circuit loss.

Due to the relatively large active areas of power solid state devices, the imput impedance and the output impedance are usually much less than the conventional 50 ohms which is employed throughout the transmission system. Extensive device evaluation of both FET and bipolar transistors from different manufacturers has shown that for most power transistors capable of several watts of power output, the optimum source and load impedances normally fall in the range between 1 and 20 ohms. Such low impedances are difficult to match to 50 ohm systems with large bandwidth. Also, the high impedance transformation ratio increases the circuit size as well as the circuit loss.

The present invention shows how to improve the circuit loss and size and the amplifier bandwidths of power combined amplifiers, by using impedance transformation couplers in the power combining of power amplifiers. These impedance transformation couplers are capable of matching arbitrary impedances and are simultaneously capable of providing arbitrary power coupling ratios. These couplers can be used as power dividers and as power combiners with equal facility. With devices having source and load impedances less than 50 ohms, each device is connected directly to the low impedance portion of each coupler. Using the approach of the present invention, the bandwidth of the amplifier circuit can be improved by an order of two to one over the prior art, and the matching circuit loss can be reduced. In addition, the individual line or branch impedances of the impedance transformation coupler are lower than for the 50 ohm to 50 ohm couplers used in the prior art, resulting in a further improvement of the loss characteristics of the power combining circuit.

The problems with the prior art are graphically illustrated in FIG. 1, which shows the power combining of two field effect transistors, 11 and 12, each having an optimum source impedance of 10 ohms and an optimum load impedance of 20 ohms. Other types of amplifier elements could be substituted for purposes of this discussion. The gate of FET 11 is connected through impedance transformation circuit 13 to port 2 of coupler 17. The gate of FET 12 is connected through impedance transformation circuit 15 to port 3 of coupler 17. The sources of each of FET's 11 and 12 are grounded. The drain of FET 11 is connected through impedance transformation circuit 14 to port 1 of coupler 18. The drain of FET 12 is connected through impedance transformation 16 to port 4 of coupler 18. The input signal is applied to port 1 of coupler 17. Port 4 of coupler 17 is connected via impedance 19 to ground. The output signal appears at port 3 of coupler 18. Port 2 of coupler 18 is connected via impedance 20 to ground. The values of impedances 19 and 20 are typically each 50 ohms, representing the characteristic impedance of the system. The function of impedance transformation circuits 13, 14, 15, and 16 is to match the optimum input and output impedances of each of the individual devices 11 and 12 to 50 ohms. Where FET's having the specified optimum impedances were tested, the circuit loss introduced by these impedance transforming elements was 0.4 dB. The couplers 17 and 18 added an additional loss of 0.15 dB, which made a total RF circuit loss of 0.55 dB.

Figure 2:
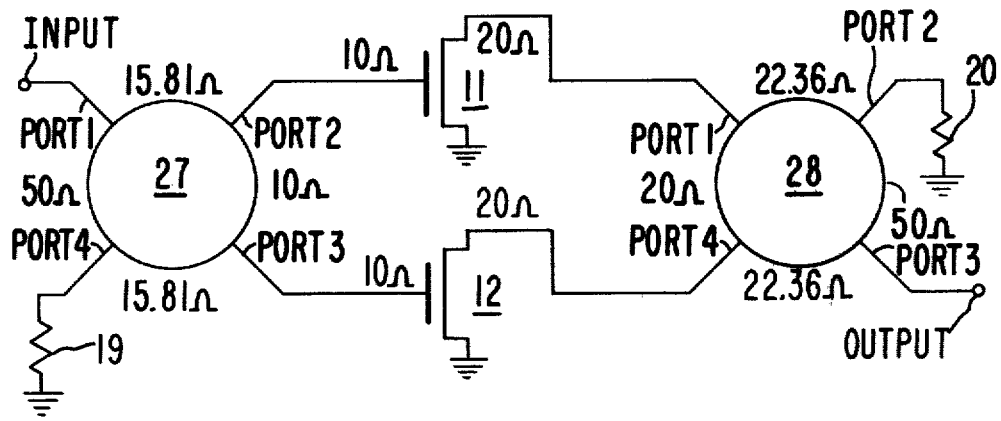
FIG. 2 is a circuit diagram of the impedance transforming couplers of the present invention in a power combining circuit of the present invention.

FIG. 2 shows how the present invention remedies the defects of the prior art. In FIG. 2 the impedance transformation is performed simultaneously with the power coupling function. The gate of FET 11 is connected directly to port 2 of coupler 27. The gate of FET 12 is connected directly to port 3 of coupler 27. The drain of FET 11 is connected directly to port 1 of coupler 28. The drain of FET 12 is connected directly to port 4 of coupler 28. Other connections are identical to those in FIG. 1. Since there are no separate impedance transformations to be performed, the size of the circuit is kept to a minimum. The loss from each coupler is less than 0.1 dB, since the impedances of the branches of the coupler are kept to lower values than before (15.81 ohms and 22.36 ohms for the cross-branches versus 35 ohms of the prior art). The total circuit loss is therefore 0.20 dB, which is 0.35 dB better than the conventional approach.

While the above Figure illustrates the case where a power combining and power dividing ratio of 1 was desired, the following analysis shows how one may construct a coupler having both arbitrary impedance transforming ratio and arbitrary power coupling ratio.

Figure 3:
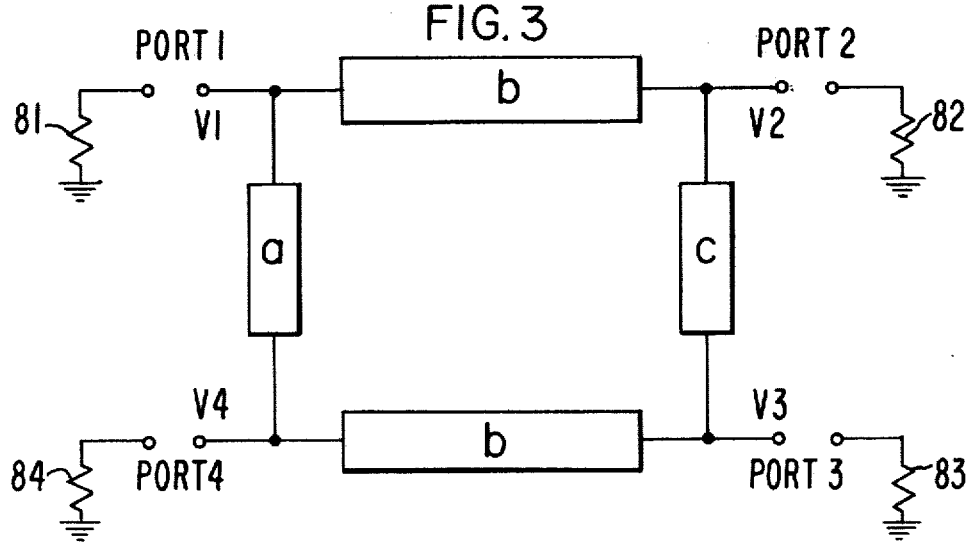
FIG. 3 is a schematic model of the impedance transforming coupler of the present invention.

The general form of the coupler of the present invention is depicted in FIG. 3. This is a model of an asymmetric coupler having arbitrary coupling (i.e., dividing or combining) ratio and arbitrary impedance matching capability. The circuit comprises four ports, designated as ports 1, 2, 3, and 4 respectively, starting at the upper left and proceeding in a clockwise direction. Ports 1 and 4 are input ports; ports 2 and 3 are output ports. Signals applied at port 1 can be reversed with signals applied at port 4, and signals applied at port 2 can be reversed with signals applied at port 3 because the coupler is symmetric about a horizontal line bifurcating the a and c normalized admittances. V1, V2, V3, and V4 are the voltage ratios (i.e., the voltage divided by one volt to make a unitless value), at ports 1, 2, 3, and 4 respectively.

Port 1 is connected to port 2 via a branch having normalized admittance b. Port 4 is connected to port 3 via a second branch having normalized admittance b. Port 1 is connected to port 4 via a third branch having normalized admittance a. Port 2 is connected to port 3 via a fourth branch having normalized admittance c.

81, 82, 83, and 84 are impedances connected between ports 1, 2, 3, and 4, respectively, and ground. Impedances 81 and 84 are normally equal to each other and impedances 82 and 83 are normally equal to each other. The source impedance $Z81 = Z84$, and the load impedance is $Z82 = Z83$, where Zn is the impedance of component n.

The following derivation describes how one obtains values for a, b, and c as a function of k, the desired power coupling ratio of the coupler, and Y, the desired admittance transformation ratio of the coupler.

Assume that an input signal having a value of 1 (e.g., 1 volt) is applied at port 1. This is equivalent to a signal of ½ applied to port 1, plus another signal having a value ½ applied to port 1, plus a signal having a value $-\frac{1}{2}$ applied to port 4, plus a signal having a value of $+\frac{1}{2}$ applied to port 4 (see FIG. 4).

FIG. 5 depicts the equivalency of this to the sum of two circuits. The first circuit, FIG. 5a, has a signal of ½ applied at port 1, and a signal of ½ applied at port 4. The second circuit, FIG. 5b, has a signal of ½ applied at port 1 and a signal of $-\frac{1}{2}$ applied at port 4. The circuit of FIG. 5a is the same as that of FIG. 4 except that an imaginary horizontal line has been drawn separating normalized admittances a and c such that the impedance Z' is infinite and the admittance Y' is zero along this line. This line divides the circuit into an upper portion 91 and an equivalent lower portion 92.

Similarly, the circuit of FIG. 5b is equivalent to the circuit of FIG. 4 except that an imaginary horizontal line has been drawn severing normalized admittances a and c such that the impedance Z' is zero and the admittance Y' is infinite along this line. This line divides the circuit into an upper portion 93 and an equivalent lower portion 94 as shown in the drawing.

R1 is the voltage ratio reflected back into an input port of FIG. 5a for a signal having value 1, so ½R1 is reflected back into each of ports 1 and 4 of FIG. 5a. T1 is the voltage ratio transmitted into an output port of FIG. 5a for a signal having a value 1, so ½T1 is transmitted into each of ports 2 and 3 of FIG. 5a. R2 is the voltage ratio reflected into an input port of FIG. 5b for a signal having value 1, so $\frac{1}{2}$R2 is reflected back into port 1 of FIG. 5b and $-\frac{1}{2}$R2 is reflected back into port 4 of FIG. 5b. T2 is the voltage ratio transmitted into an output port of FIG. 5b for a signal having a value 1, so $\frac{1}{2}$T2 is transmitted into port 2 of FIG. 5b and $-\frac{1}{2}$T2 is transmitted into port 3 of FIG. 5b. Thus, it is seen that:

$$V1 = \tfrac{1}{2}(R1+R2) \tag{1}$$

$$V2 = \tfrac{1}{2}(T1+T2) \tag{2}$$

$$V3 = \tfrac{1}{2}(T1-T2) \tag{3}$$

$$V4 = \tfrac{1}{2}(R1-R2) \tag{4}$$

Let L equal the electrical length of each of the four branch lines a, b, c, d in FIG. 4. Thus, in FIG. 5a and FIG. 5b the lengths of normalized admittances b are each L, and the length of the remaining stubs of normalized admittances a and c are L/2 in each case. $\lambda$ is the wavelength at the central operating frequency. Let M1 be the ABCD matrix of circuit 91. Then:

$$M1 = \begin{bmatrix} 1 & 0 \\ ja\tan\frac{\pi L}{\lambda} & 1 \end{bmatrix} \begin{bmatrix} \cos\frac{2\pi L}{\lambda} & \frac{j}{b}\sin\frac{2\pi L}{\lambda} \\ jb\sin\frac{2\pi L}{\lambda} & \cos\frac{2\pi L}{\lambda} \end{bmatrix} \begin{bmatrix} 1 & 0 \\ jc\tan\frac{\pi L}{\lambda} & 1 \end{bmatrix} \tag{5a}$$

Let M2 be the ABCD matrix of circuit 93. Then:

$$M2 = \begin{bmatrix} 1 & 0 \\ -ja\cot\frac{\pi L}{\lambda} & 1 \end{bmatrix} \begin{bmatrix} \cos\frac{2\pi L}{\lambda} & \frac{j}{b}\sin\frac{2\pi L}{\lambda} \\ jb\sin\frac{2\pi L}{\lambda} & \cos\frac{2\pi L}{\lambda} \end{bmatrix} \begin{bmatrix} 1 & 0 \\ -jc\cot\frac{\pi L}{\lambda} & 1 \end{bmatrix} \tag{5b}$$

A good length for each conductor of a branch line coupler is a quarter wavelength. Thus, let $L = \lambda/4$. Then:

$$M1 = \begin{bmatrix} -\frac{c}{b} & \frac{j}{b} \\ -\frac{jac}{b} + jb & -\frac{a}{b} \end{bmatrix} \equiv \begin{bmatrix} A1 & B1 \\ C1 & D1 \end{bmatrix} \tag{6}$$

Similarly, $$M2 = \begin{bmatrix} \frac{c}{b} & \frac{j}{b} \\ -\frac{jac}{b} + jb & \frac{a}{b} \end{bmatrix} \begin{bmatrix} A2 & B2 \\ C2 & D2 \end{bmatrix} \tag{7}$$

Now, the definition of an ABCD matrix yields, for circuit 91:

$$\begin{bmatrix} Ein \\ Iin \end{bmatrix} = \begin{bmatrix} A1 & B1 \\ C1 & D1 \end{bmatrix} \begin{bmatrix} Eout \\ Iout \end{bmatrix} \tag{8}$$

where Ein is the input voltage, Iin is the input current, Eout is the output voltage, and Iout is the output current. Thus, $$Ein = A1 \cdot Eout + B1 \cdot Iout = (A1 + B1 \cdot Yout)Eout \tag{9}$$

and $$Iin = C1 \cdot Eout + D1I9 \; Iout = (C1 + D1 \cdot Yout)Eout \tag{10}$$

where Yout, the output admittance, is equal to Iout/Eout. If we normalize the source impedance against the characteristic impedance of the system, then the source impedance is one, and the output admittance Yout equal Y, the desired admittance transformation ratio of the coupler. The input impedance is Zin.

$$Zin = \frac{Ein}{Iin} = \frac{A1 + B1 \cdot Y}{C1 + D1 \cdot Y} \tag{11}$$

According to the definition of reflected voltage ratio from transmission line theory, $$R1 = \frac{Zin - 1}{Zin + 1} = \frac{(A1 - D1 \cdot Y) + (B1 \cdot Y - C1)}{(A1 + D1 \cdot Y) + (B1 \cdot Y + C1)} \tag{12}$$

The definition of transmitted voltage ratio T1 is:

$$T1 = \frac{Eout}{Ein} = \frac{1}{A1 + B1 \cdot Y} = \frac{b}{jY - c} \tag{13}$$

Similarly, $$R2 = \frac{(A2 - D2 \cdot Y) + (B2 \cdot Y - C2)}{(A2 + D2 \cdot Y) + (B2 \cdot Y - C1)} \tag{14}$$

and $$T2 = \frac{1}{A2 + B2 \cdot Y} = \frac{b}{jY + c} \tag{15}$$

For a perfect match and perfect isolation, V1 equals V4 equals zero. Thus, R1 equals zero and from equation 12:

$$A1 - C1 + (B1 - D1)Y = 0 \tag{16}$$

$$-c - jb^2 + jac + (j+a)Y = 0 \tag{17}$$

$$aY - c + j(Y + ac - b^2) = 0 \tag{18}$$

$$aY - c = 0 \tag{19}$$

$$Y = b^2 - ac \tag{20}$$

Now, from equations 2 and 3, $$V2 = \tfrac{1}{2}(T1 + T2) = \frac{-jbY}{c^2 + Y^2} \tag{21}$$

$$V3 = \tfrac{1}{2}(T1 - T2) = \frac{-bc}{c^2 + Y^2} \tag{22}$$

For an ideal coupler, the power appearing at port 4 is zero because all the input power appears at ports 2 and 3. Thus, for a normalized input power of 1:

$$Y |V2|^2 + Y |V3|^2 = 1 \tag{23}$$

$$\frac{b^2 \cdot Y^3}{(c^2 + Y^2)^2} + \frac{b^2 \cdot c^2 \cdot Y}{(c^2 + Y^2)^2} = 1 \tag{24}$$

The desired power coupling ratio of the coupler is k, the ratio of the power at port 2 to the power at port 3.

$$k = \frac{|V2|^2}{|V3|^2} = \frac{Y^2}{c^2} \tag{26}$$

Thus, $$c = Y/\sqrt{k} \tag{27}$$

Substituting from equations 19 and 20:

$$a = 1/\sqrt{k} \tag{28}$$

$$b = \sqrt{(Y/k) + Y} \tag{29}$$

We have thus specified the normalized admittances a, b, and c as a function of the desired arbitrary power division ratio, k, and the desired arbitrary admittance transformation ratio, Y. It is now a straightforward task to convert these normalized admittances into actual admittances by the formula "actual admittance = (normalized admittance) (source admittance)" and then into physical dimensions for certain conductors. Bahl and Trivedi, "A Designer's Guide to Microstrip Line," *Microwaves*, May, 1977, p. 174 et seq. A circuit thus built will work extremely well over a wide range of frequencies. At the center frequency, the phase differential between ports 2 and 3 is exactly 90° and the voltage standing wave ratio of the coupler is exactly 1 to 1. These parameters deviate but slightly as the frequency is moved away from the center frequency.

To make the coupler as broadbanded as possible it is desirable to curve into a circular arc each of the four conductors comprising the four branches of the coupler. This is depicted in FIG. 6, which is a shadowgraph tracing of a C-band hybrid (i.e., k = 1) coupler having a 50 ohm output load impedance and a 16 ohm input impedance. Isolation between the two output ports (ports 2 and 3) was measured at better than 28 dB. The coupling variation between the two output ports was less than 0.13 dB and the mid-band insertion loss was 0.10 dB. The measured performance of the coupler corresponded closely to the theoretical calculation. A complete power combined FET amplifier was designed and fabricated using the coupler depicted in FIG. 6.

Comparing the test results to those from the conventional approach showed that the impedance transformation coupler significantly improved the amplifier bandwidth and the amplifier power output.

The above description is included to illustrate the operation of the preferred embodiments, and does not limit the scope of the invention. The scope of the invention is to be limited only by the following claims. From the above discussion, many variations will be apparent to one skilled in the art that would yet be encompassed by the spirit and scope of the invention.

What is claimed is:

1. A quadrature directional coupler comprising first, second, third, and fourth conductive branches having precalculated admittances, said coupler having any desired impedance transformation capability and any desired power coupling capability;
   wherein the first branch is connected to each of the third and fourth branches, the second branch is connected to each of the third and fourth branches, the third branch is connected to each of the first and second branches, and the fourth branch is connected to each of the first and second branches;
   wherein said first branch has a normalized admittance equal to $1/\sqrt{k}$;
   said second branch has a normalized admittance equal to $1/(Z\sqrt{k})$; and
   said third and fourth branches each have normalized admittances equal to $\sqrt{1/(Zk) + (1/Z)}$;
   where Z is the desired impedance transformation ratio of the coupler and k is the desired power coupling ratio, k not being equal to one.

2. The coupler of claim 1 wherein said coupler can be used as both a power divider and a power combiner.

3. The coupler of claim 1 wherein said coupler is operable at microwave frequencies.

4. The coupler of claim 1 wherein the length of each branch is equal to an odd multiple of one quarter of the wavelength at the central operating frequency of the coupler.

5. The coupler of claim 1 wherein the branches of said coupler are curved into circular arcs.

6. A microstrip circuit operable at microwave frequencies for power combining two amplifiers in which the optimum input impedance of at least one of said amplifiers differs from the input impedance of said circuit, said circuit comprising:
   a power dividing coupler consisting essentially of four series-connected microstrip branches and having two input ports and two output ports; wherein
   a first branch has a normalized admittance equal to $1/\sqrt{k}$;
   second branch has a normalized admittance equal to $1/(Z\sqrt{k})$; and
   a third and fourth branch each have normalized admittances equal to $\sqrt{1/(Zk) + (1/Z)}$;
   where Z is the desired impedance transformation ratio of the coupler and k is the desired power coupling ratio, k not being equal to one;
   two amplifiers, the input of each of which is connected to a different one of said output ports of said power dividing coupler; and
   a power combining coupler having two input ports and two output ports; wherein
   the outputs of each of said amplifiers are connected to a different one of said input ports of said power combining coupler; wherein a different amount of power flows through each of said amplifiers; and
   said power dividing coupler has a power division ratio other than one and simultaneously matches the input impedance of the circuit to the optimum input impedances of said amplifiers.

7. A microstrip circuit operable at microwave frequencies for power combining two amplifiers in which the optimum output impedance of at least one of said amplifiers differs from the output impedance of said circuit, said circuit comprising:
   a power dividing coupler having two input ports and two output ports;
   two amplifiers, the input of each of which is connected to a different one of said output ports of said power dividing coupler; and
   a power combining coupler consisting essentially of four series-connected microstrip branches and having two input ports and two output ports; wherein
   a first branch has a normalized admittance equal to $1/\sqrt{k}$;
   second branch has a normalized admittance equal to $1/(Z\sqrt{k})$; and a third and fourth branch each have normalized admittances equal to $\sqrt{1/(Zk)+(1/Z)}$;

where Z is the desired impedance transformation ratio of the coupler and k is the desired power coupling ratio, k not being equal to one;

wherein the outputs of each of said amplifiers are connected to a different one of said input ports of said power combining coupler;

wherein a different amount of power flows through each of said amplifiers; and said power combining coupler has a power combination ratio other than one and simultaneously matches the output impedance of the circuit to the optimum output impedances of said amplifiers.

* * * * *